US012652991B2

(12) United States Patent
Roh et al.

(10) Patent No.: US 12,652,991 B2
(45) Date of Patent: **\*Jun. 9, 2026**

(54) SEMICONDUCTOR PROCESSING APPARATUS

(71) Applicant: ASM IP Holding B.V., Almere (NL)

(72) Inventors: JaeMin Roh, Hwaseong-si (KR); ChangMin Lee, Hwaseong-si (KR)

(73) Assignee: ASM IP Holding B.V., Almere (NL)

( \* ) Notice: Subject to any disclaimer, the term of this patent is extended or adjusted under 35 U.S.C. 154(b) by 932 days.

This patent is subject to a terminal disclaimer.

(21) Appl. No.: 17/721,892

(22) Filed: Apr. 15, 2022

(65) Prior Publication Data

US 2022/0336240 A1     Oct. 20, 2022

Related U.S. Application Data

(60) Provisional application No. 63/177,275, filed on Apr. 20, 2021.

(51) Int. Cl.
*H01L 21/67*        (2006.01)
*H01L 21/68*        (2006.01)
*H01L 21/687*       (2006.01)

(52) U.S. Cl.
CPC .. *H01L 21/67253* (2013.01); *H01L 21/67017* (2013.01); *H01L 21/68* (2013.01); *H01L 21/68764* (2013.01)

(58) Field of Classification Search
CPC ......... H01L 21/67253; H01L 21/67017; H01L 21/68; H01L 21/68764; H01L 21/67103;

H01L 21/67155; H01L 21/67213; H01L 21/67109; C23C 16/4585; C23C 16/4412; C23C 16/45589; C23C 16/54; B24B 37/11

See application file for complete search history.

(56) References Cited

U.S. PATENT DOCUMENTS

| | | | | |
|---|---|---|---|---|
| 10,998,172 | B2 * | 5/2021 | Lavitsky | ........... H01J 37/32834 |
| 11,384,431 | B2 * | 7/2022 | Nakayama | .......... H01J 37/3266 |
| 11,443,926 | B2 | 9/2022 | Jeong et al. | |
| 11,823,876 | B2 | 11/2023 | Lee et al. | |
| 11,923,181 | B2 * | 3/2024 | Moon | ............... H01J 37/32449 |
| 2010/0279008 | A1 * | 11/2010 | Takagi | .............. C23C 16/45565 |
| | | | | 118/725 |
| 2010/0310772 | A1 * | 12/2010 | Tsuda | .................... C23C 16/409 |
| | | | | 427/255.28 |

(Continued)

FOREIGN PATENT DOCUMENTS

| | | | | | |
|---|---|---|---|---|---|
| CN | 111081600 | A | * | 4/2020 | ....... H01L 21/68792 |
| CN | 111081601 | A | * | 4/2020 | ....... H01L 21/68792 |

(Continued)

*Primary Examiner* — Mohammed Shamsuzzaman
(74) *Attorney, Agent, or Firm* — Snell & Wilmer L.L.P.

(57) ABSTRACT

A substrate processing apparatus capable of improving the uniformity of thin films on a substrate includes: a substrate support unit having a first slope; and a flow control ring arranged to surround the substrate support unit and having a second slope, wherein, during alignment, as the substrate support unit moves in a first direction, the first slope and the second slope contact each other, and due to the contact, the flow control ring slides in a second direction that is different from the first direction.

18 Claims, 15 Drawing Sheets

(56)                References Cited

U.S. PATENT DOCUMENTS

| | | | | |
|---|---|---|---|---|
| 2016/0153088 A1* | 6/2016 | Tsuji | ................... | C23C 16/4408 |
| | | | | 118/728 |
| 2016/0355928 A1* | 12/2016 | Toriya | ................. | C23C 16/4412 |
| 2019/0096638 A1* | 3/2019 | Lavitsky | ............... | C23C 14/351 |
| 2019/0139808 A1* | 5/2019 | White | ................. | C23C 16/4585 |
| 2019/0221432 A1* | 7/2019 | Adachi | ................. | C23C 16/042 |
| 2020/0126840 A1* | 4/2020 | Roh | ................. | H01L 21/68764 |
| 2020/0234989 A1* | 7/2020 | Jeong | ............... | H01L 21/67017 |
| 2020/0294833 A1* | 9/2020 | Takano | ................. | C23C 16/458 |
| 2021/0035783 A1* | 2/2021 | Taira | ................. | H01J 37/32715 |
| 2021/0156024 A1* | 5/2021 | Roh | ................... | C23C 16/4412 |
| 2022/0044913 A1* | 2/2022 | Jeong | ................. | H01L 21/6719 |
| 2022/0259731 A1* | 8/2022 | Tsuji | ................. | C23C 16/45553 |
| 2022/0293398 A1* | 9/2022 | Jeong | ................. | C23C 16/4585 |
| 2023/0137026 A1* | 5/2023 | Susa | ................. | H01L 21/31116 |
| | | | | 118/722 |

FOREIGN PATENT DOCUMENTS

| | | | | | | |
|---|---|---|---|---|---|---|
| CN | 112309899 | A | * | 2/2021 | ....... | H01L 21/67017 |
| CN | 117248192 | A | * | 12/2023 | ....... | C23C 16/45553 |
| JP | 2010514216 | A | * | 4/2010 | .......... | H01J 37/3244 |
| JP | 6056403 | B2 | * | 1/2017 | ........ | C23C 16/4585 |
| KR | 20140045806 | A | * | 4/2014 | ....... | H01L 21/67017 |
| KR | 101771901 | B1 | * | 8/2017 | ....... | H01L 21/67196 |
| KR | 20190049950 | A | * | 5/2019 | ....... | H01L 21/68742 |
| KR | 20190092154 | A | * | 8/2019 | ....... | H01L 21/68735 |
| KR | 20210015641 | A | * | 2/2021 | ........ | C23C 16/4412 |
| TW | 202029401 | A | * | 8/2020 | ....... | H01L 21/67103 |

* cited by examiner

SEMICONDUCTOR PROCESSING APPARATUS

CROSS-REFERENCE TO RELATED APPLICATIONS

This application claims the benefit of U.S. Provisional Application No. 63/177,275, filed on Apr. 20, 2021, in the United States Patent and Trademark Office, the disclosure of which is incorporated herein in its entirety by reference.

BACKGROUND

1. Field

One or more embodiments relate to a substrate processing apparatus, and more particularly, to a substrate processing apparatus capable of improving the uniformity of thin films by correcting the position of a substrate support unit.

2. Description of the Related Art

In processing a substrate such as a semiconductor/display substrate, a substrate processing apparatus is operated for a long time for productivity and efficient commercial operation. However, such long operation increases the fatigue of a device. In particular, the fatigue is large in the case of a reactor part that is not fixed and moves periodically. For example, due to repeated movements such as substrate loading/unloading and/or due to thermal deformation caused by a high temperature process, the centering position of a substrate support unit may be distorted. As a result, the uniformity of a thin film on a substrate, particularly the uniformity of a thin film at an edge of the substrate, becomes uneven or deteriorates, and thus a defect rate of a semiconductor device may increase.

SUMMARY

One or more embodiments include a substrate processing apparatus capable of improving the uniformity of thin films on a substrate by repairing the misalignment of centering of a substrate support unit due to long-term use of the substrate processing apparatus, and maintaining a constant gap between a substrate support apparatus and a gas supply control ring.

Additional aspects will be set forth in part in the description which follows and, in part, will be apparent from the description, or may be learned by practice of the presented embodiments of the disclosure.

According to one or more embodiments, a substrate processing apparatus includes: a substrate support unit having a first slope; a flow control ring arranged to surround the substrate support unit and having a second slope; and a processing unit on the substrate support unit, wherein a reaction space is formed between the substrate support unit and the processing unit, a lower space is formed under the substrate support unit, a gap is formed between the first slope of the substrate support unit and the second slope of the flow control ring, the reaction space and the lower space are connected to each other through the gap, gas is supplied by the processing unit during a processing operation of the substrate processing apparatus, and the substrate support unit is higher than the flow control ring during the supply of the gas, so that a portion of the first slope of the substrate support unit is exposed to the reaction space.

According to an example of the substrate processing apparatus, a first upper surface of the substrate support unit may be higher than a second upper surface of the flow control ring.

According to another example of the substrate processing apparatus, the substrate processing apparatus may further include an exhaust unit defining an exhaust space surrounding the reaction space, and a channel between the reaction space and the exhaust space may be lower than the first upper surface of the substrate support unit.

According to another example of the substrate processing apparatus, during the processing operation, the gas supplied by the processing unit may flow downstream from the reaction space toward the channel.

According to another example of the substrate processing apparatus, while the gas flows downstream, the gas may move along the portion of the first slope.

According to another example of the substrate processing apparatus, with a configuration in which the substrate support unit is higher than the flow control ring and a configuration in which the gas flows downstream, inflow of gas from the lower space into the reaction space through the gap may be suppressed.

According to another example of the substrate processing apparatus, the substrate processing apparatus may further include a support configured to support the processing unit and the exhaust unit, and the flow control ring may be seated on a step on the support.

According to another example of the substrate processing apparatus, the step may be included in the support.

According to another example of the substrate processing apparatus, the substrate processing apparatus may further include an outer ring arranged between the flow control ring and the support, and the step may be included in the outer ring.

According to another example of the substrate processing apparatus, the step may include a guide groove, and the flow control ring may include: a ring body extending from the first slope; and a stopper extending from the ring body toward the guide groove.

According to another example of the substrate processing apparatus, the ring body may include a central portion; a first portion extending from the central portion in a first direction; a second portion extending from the central portion in a second direction opposite to the first direction; and an inclined portion extending from the second portion to form the second slope, wherein the stopper may extend from the central portion.

According to another example of the substrate processing apparatus, the first portion may extend so that the guide groove is covered by the first portion in a state where the stopper is in contact with a first sidewall of the guide groove.

According to another example of the substrate processing apparatus, the second portion may extend so that the entire inclined portion protrudes from the step in a state where the stopper is in contact with a second sidewall of the guide groove.

According to another example of the substrate processing apparatus, the first portion may extend so that a side surface of the first portion and a side surface of the step are apart from each other in a state where the stopper is in contact with the second sidewall of the guide groove.

According to another example of the substrate processing apparatus, when a distance from the stopper to the second sidewall of the guide groove is A and a width of a portion protruding from the step of the second portion is A', A' may be greater than or equal to A.

According to another example of the substrate processing apparatus, when a width of a portion of the first portion overlapping the step is B and a distance from the stopper to the first sidewall of the guide groove is B', B may be greater than B'.

According to another example of the substrate processing apparatus, the step may include a side surface facing the first portion, and when a width of the first portion is C and a distance from the first portion to the side surface is C', C may be equal to or less than C'.

According to another example of the substrate processing apparatus, during alignment, as the substrate support unit moves up, the first slope and the second slope contact each other, and thus the flow control ring moves up together. Thereafter, as the substrate support unit moves down, the gap having a constant width may be formed over a circumference of the substrate support unit.

According to one or more embodiments, a substrate processing apparatus includes: a substrate support unit; a flow control ring arranged to surround the substrate support unit; and a processing unit on the substrate support unit, wherein a reaction space is formed between the substrate support unit and the processing unit, a lower space is formed under the substrate support unit, a gap is formed between the substrate support unit and the flow control ring, the reaction space and the lower space are connected to each other through the gap, a first upper surface of the substrate support unit is higher than a second upper surface of the flow control ring, and gas supplied by the processing unit flows from a space on the first upper surface to a space on the second upper surface.

According to one or more embodiments, a substrate processing apparatus includes: a substrate support unit having a first slope; and a flow control ring arranged to surround the substrate support unit and having a second slope, wherein, during alignment, as the substrate support unit moves in a first direction, the first slope and the second slope contact each other, and due to the contact, the flow control ring may slide in a second direction that is different from the first direction.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
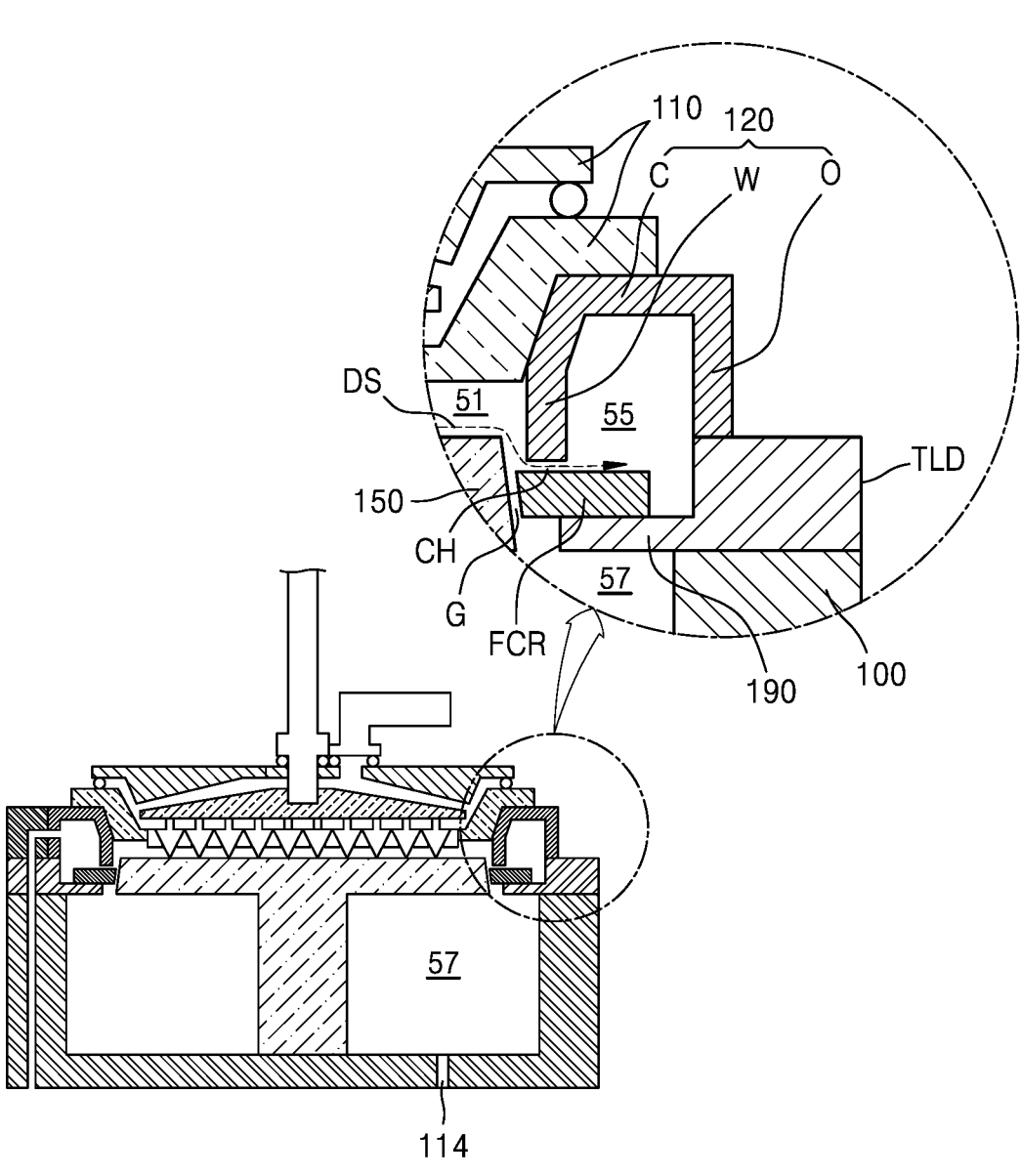
FIGS. 1 and 2 are views of a substrate processing apparatus according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described more fully with reference to the accompanying drawings.

In this regard, the present embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

Figure 2:
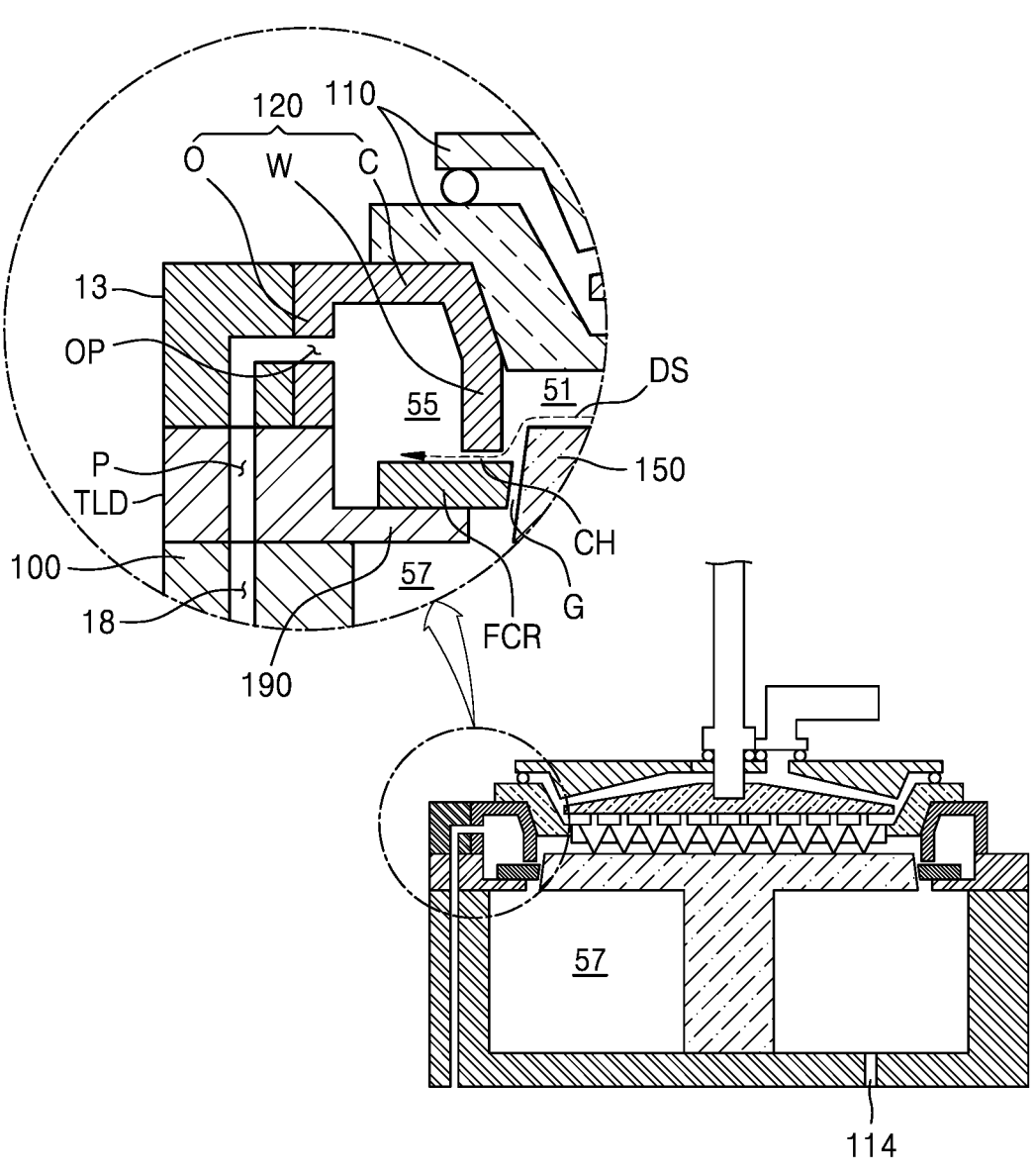

FIGS. 1 and 2 are views of a substrate processing apparatus according to embodiments of the inventive concept. FIG. 1 shows a substrate processing apparatus and a portion (cross-section of a portion where an opening of an exhaust unit 120 is not formed) of the substrate processing apparatus.

FIG. 2 shows a substrate processing apparatus and another portion (cross-section of a portion where an opening OP of the exhaust unit 120 is formed) of the substrate processing apparatus.

Referring to FIGS. 1 and 2, the substrate processing apparatus may include a partition 100, a substrate support unit 150, a processing unit 110, an exhaust unit 120, and a flow control unit FCR. The substrate processing apparatus may include a reaction space 51 and an exhaust space 55 connected to the reaction space 51.

The partition 100 is a chamber for receiving the substrate support unit 150, which may also be referred to as a chamber. In an embodiment, a reactor including the reaction space 51 is referred to as an inner chamber, and the entire structure of the substrate processing apparatus surrounding a plurality of reactors (e.g., four reactors) may be referred to as an outer chamber. An exhaust line 18 may be provided in the partition 100. In some embodiments, the exhaust line 18 may be formed to extend along the inside of a sidewall of the partition 100.

The processing unit 110 may be located on the substrate support unit 150 configured to support a substrate. The reaction space 51 may be defined between the substrate support unit 150 and the processing unit 110. The processing unit 110 may serve as a first lid that defines an upper surface of the reaction space 51. In other words, the first lid on the substrate support unit may include at least one processing unit 110.

The processing unit 110 may include members that perform appropriate functions depending on a function of the substrate processing apparatus. For example, when the substrate processing apparatus performs a deposition function, the processing unit 110 may include a reactant supplier (e.g., a showerhead assembly). In another embodiment, when the reactor performs a polishing function, the processing unit 110 may include a polishing pad.

The processing unit 110 may be a conductor and may be used as an electrode for generating plasma. That is, the processing unit 110 may serve as one electrode for generating plasma. The processing unit 110 in this manner (the manner in which the processing unit 110 is used as an electrode) is hereinafter referred to as a gas supply electrode.

The substrate support unit 150 may be configured to provide an area where an object to be processed (not shown) such as a semiconductor or a display substrate is seated. The substrate support unit 150 may be supported by a driver (not shown) capable of vertical and/or rotational movement. Further, the substrate support unit 150 may be a conductor and may be used as an electrode for generating plasma (i.e., an opposite electrode of a gas supply electrode).

The substrate support unit 150 may be configured to have a first slope. For example, a side surface of the substrate support unit 150 may extend to have an inclination. That is, the side surface of the substrate support unit 150 may extend from an upper surface (i.e., a surface facing the processing unit 110, hereinafter referred to as a first upper surface) to a lower surface in a direction other than a right angle. In some embodiments, the substrate support unit 150 may have a trapezoidal cross-section.

In some embodiments, the substrate support unit 150 may be higher than a flow control ring FCR. As a specific example, a first upper surface of the substrate support unit 150 may be higher than an upper surface (i.e., a surface facing a boundary wall W, hereinafter referred to as a second upper surface) of the flow control ring FCR. Accordingly, a portion of a first slope of the substrate support unit 150 may face the flow control ring FCR, and another portion of the first slope may be exposed to the reaction space 51. In an additional embodiment, the other portion of the first slope may be exposed to a lower space 57.

The exhaust unit 120 may be between the processing unit 110 and a support TLD. The exhaust unit 120 may extend to surround the reaction space 51. Gas in the reaction space 51 may be exhausted to an exhaust port 13 through the exhaust unit 120.

In an embodiment, the exhaust unit 120 may serve as a second lid that defines a side surface of the reaction space 51. The second lid including the exhaust unit 120 may include the exhaust space 55 connected to the reaction space 51. Therefore, the exhaust unit 120 may provide the exhaust space 55. Further, the exhaust unit 120 may provide a space in which the processing unit 110 is received. When the processing unit 110 is received in the space, the processing unit 110 may be in contact with the exhaust unit 120.

The exhaust unit 120 may include the boundary wall W between the reaction space 51 and the exhaust space 55. A first surface (e.g., an outer surface) of the boundary wall W may define the reaction space 51 and a second surface (i.e., an inner surface as a surface opposite to the first surface) of the boundary wall W may define the exhaust space 55. For example, the reaction space 51 may be defined by the first surface of the boundary wall W, an upper surface of the substrate support unit 150, and a lower surface of the processing unit 110 that is the first lid. In other words, a side surface of the reaction space 51 may be defined by the boundary wall W of the exhaust unit 120.

The exhaust unit 120 may provide a portion of a space for the object to be processed. For example, when the substrate processing apparatus performs a deposition function, the reaction space 51 for deposition may be defined by the exhaust unit 120. Further, the exhaust space 55 may be defined inside the exhaust unit 120. The reaction space 51 may be connected to the exhaust port 13 through the exhaust space 55 of the exhaust unit 120. In more detail, gas in the reaction space 51 may be exhausted to the exhaust port 13 through a channel CH, the exhaust space 55, and the opening OP.

In an example, the exhaust unit 120 may include a connecting wall C and the outer wall O extending from the boundary wall W. The outer wall O of the exhaust unit 120 is arranged in parallel with the boundary wall W and may contact the support TLD. The opening OP may be formed in the outer wall O, and the exhaust unit 120 and the exhaust port 13 may be connected to each other through the opening OP. The connecting wall C of the exhaust unit 120 may extend to connect the boundary wall W to the outer wall O. The connecting wall C may provide a contact surface with the processing unit 110. The processing unit 110, which is the first lid, and the exhaust unit 120, which is the second lid, may be in contact with each other by the contact surface.

The support TLD may contact the exhaust unit 120 to support the processing unit 110 and the exhaust unit 120. The support TLD may be supported by the partition 100. As described above, the support TLD may serve as a top lid that is supported by the partition 100 to cover an outer chamber while supporting the processing unit 110 as the first lid and the exhaust unit 120 as the second lid.

The support TLD may be between the partition 100 and a lid (e.g., the second lid including the exhaust unit 120). In addition, the support TLD may be between the partition 100 and the exhaust port 13. The support TLD may include a path P connecting the exhaust port 13 to the exhaust line 18 of the partition 100. In additional embodiments, a sealing member (not shown) may be between the support TLD and the partition. The sealing member may extend along a circumference of the path P or the exhaust line 18, thereby preventing leakage of gas moving from the path P to the exhaust line 18.

Figure 7:
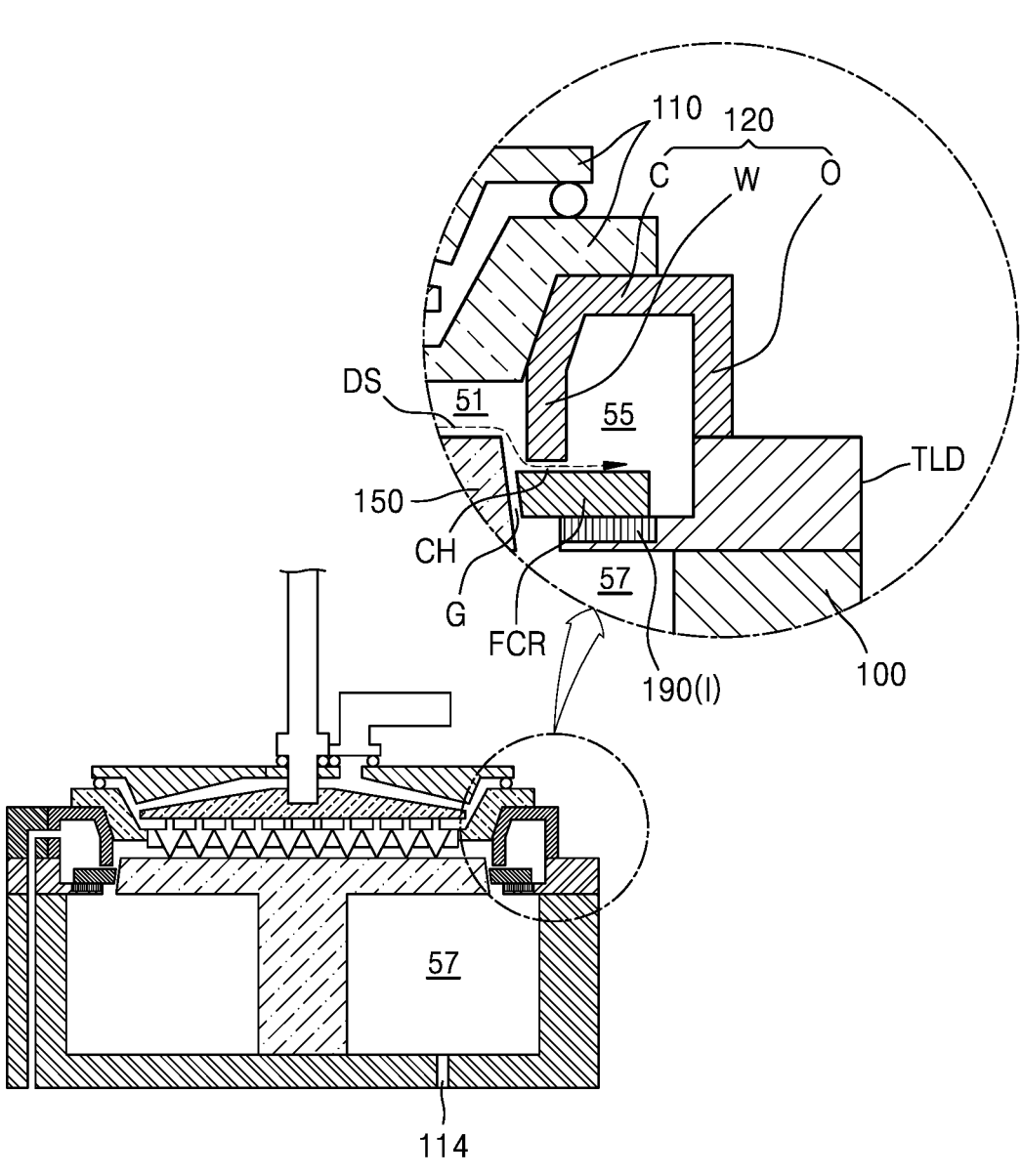
FIG. 7 is a view of a substrate processing apparatus according to embodiments of the inventive concept.

A step 190 may be on the support TLD. The flow control ring FCR may be seated on the step 190. That is, the flow control ring FCR may slide on the step 190 to move in a lateral direction. The step 190 may be included in the support TLD as shown in FIGS. 1 and 2. In another example, the step 190 may be included in an outer ring that is a separate configuration from the support TLD, as shown in FIG. 7.

The flow control ring FCR may be arranged to surround the substrate support unit 150. The flow control ring FCR may be below the exhaust unit 120. In more detail, the flow control ring FCR may be arranged to overlap at least a portion of the exhaust unit 120 in the vertical direction. Due to this overlapping arrangement, the channel CH may be formed between the flow control ring FCR and the exhaust unit 120. As a result, a first gas (e.g., source gas and/or reaction gas) in the reaction space 51 may be transmitted to the exhaust space 55 of the exhaust unit 120 through a second surface of the flow control ring FCR.

In more detail, the boundary wall W of the exhaust unit 120 may provide the channel CH connecting the reaction space 51 to the exhaust space 55. For example, the channel CH may be formed between the exhaust unit 120 and the flow control ring FCR. The channel CH may function as a path between the reaction space 51 and the exhaust space 55. Therefore, the reaction space 51 and the exhaust space 55 may communicate with each other through the channel CH provided by the boundary wall W.

The channel CH may be lower than the first upper surface of the substrate support unit 150. Therefore, when gas supplied to the processing unit 110 is sprayed toward a target substrate on the substrate support unit 150 during the processing, the gas may flow downstream from the reaction space 51 toward the channel CH. During this downstream flow DS, the gas will move from an upper surface of the target substrate to the channel CH along an exposed portion of the first slope of the substrate support unit 150.

With this configuration of the substrate processing apparatus (i.e., a configuration in which the substrate support unit 150 is higher than the flow control ring FCR), a flow of the gas supplied by the processing unit 110 from the reaction space 51 to the exhaust space 55 may be promoted. In addition, due to the above-described configuration and the configuration in which the gas of the processing unit 110 flows downstream, inflow of gas (e.g., filling gas) from the lower space 57 into the reaction space 51 through a gap G may be suppressed. Because the gas supplied by the processing unit 110 flows downward from a space on the first upper surface of the substrate support unit 150 toward a space on a second upper surface of the flow control ring FCR, the flow of gas (e.g., a filling gas) to flow upward from the sub-space 57 may be suppressed.

In some embodiments, the flow control ring FCR may be configured to have a second slope. For example, a side surface of the flow control ring FCR may extend to have an inclination. That is, the side surface of the flow control ring FCR may extend from an upper surface to a lower surface in a direction other than a right angle. In some embodiments, a second slope of the flow control ring FCR may be substantially parallel to the first slope of the substrate support unit 150.

The flow control ring FCR may be apart from the substrate support unit 150 to form the gap G. For example, the gap G may extend between the second slope of the flow control ring FCR and the first slope of the substrate support unit 150. The reaction space 51 and the lower space 57 may be connected to each other through the gap G.

The flow control ring FCR may move laterally on the support TLD (i.e., slide against the support TLD). By adjusting a width or spacing of the gap G through the lateral movement, alignment between the substrate support unit 150 and the flow control ring FCR may be achieved. Accordingly, a pressure balance between the reaction space 51 and the lower space 57 (i.e., an inner space of an outer chamber) under the substrate support unit 150 may be controlled.

Figure 14:
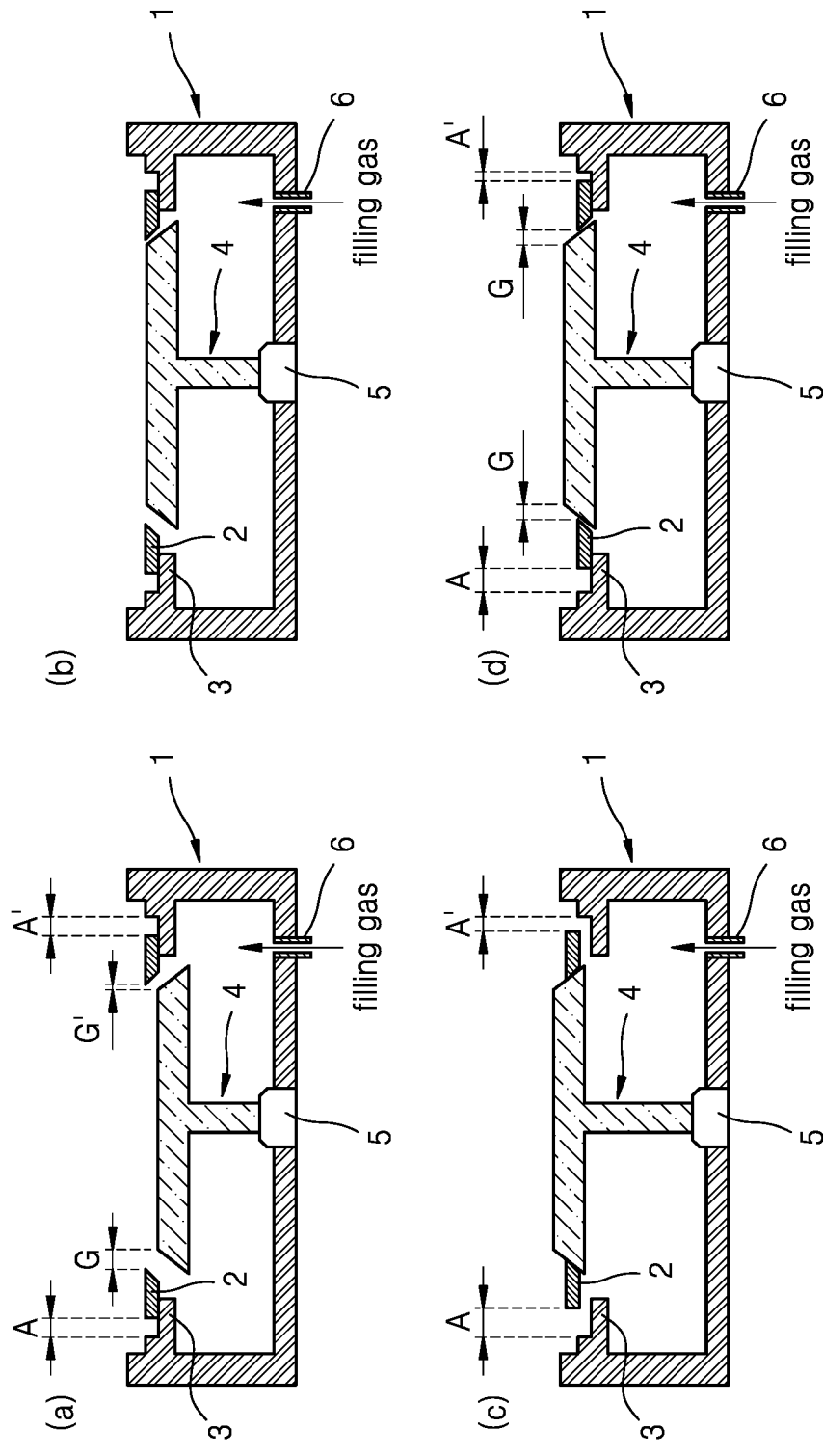

In more detail, referring to FIGS. 1, 2, and 14, during the alignment of the substrate processing apparatus, the substrate support unit 150 may move up and down (see FIG. 14B). As the substrate support unit 150 moves up and down, the first slope of the substrate support unit 150 and the second slope of the flow control ring FCR may contact each other. Due to the contact, the flow control ring FCR ascends together (see FIG. 14C), and the substrate support unit 150 descends thereafter, so that the flow control ring FCR may be seated on the support TLD (see FIG. 14D).

As such, when the substrate support unit 150 moves (e.g., elevates) in a first direction in a state where the first slope of the substrate support unit 150 contacts the second slope of the flow control ring FCR, the flow control ring FCR may move in the second direction (e.g., lateral sliding), thereby forming the gap G having a constant width over the circumference of the support unit 150.

Figure 3:
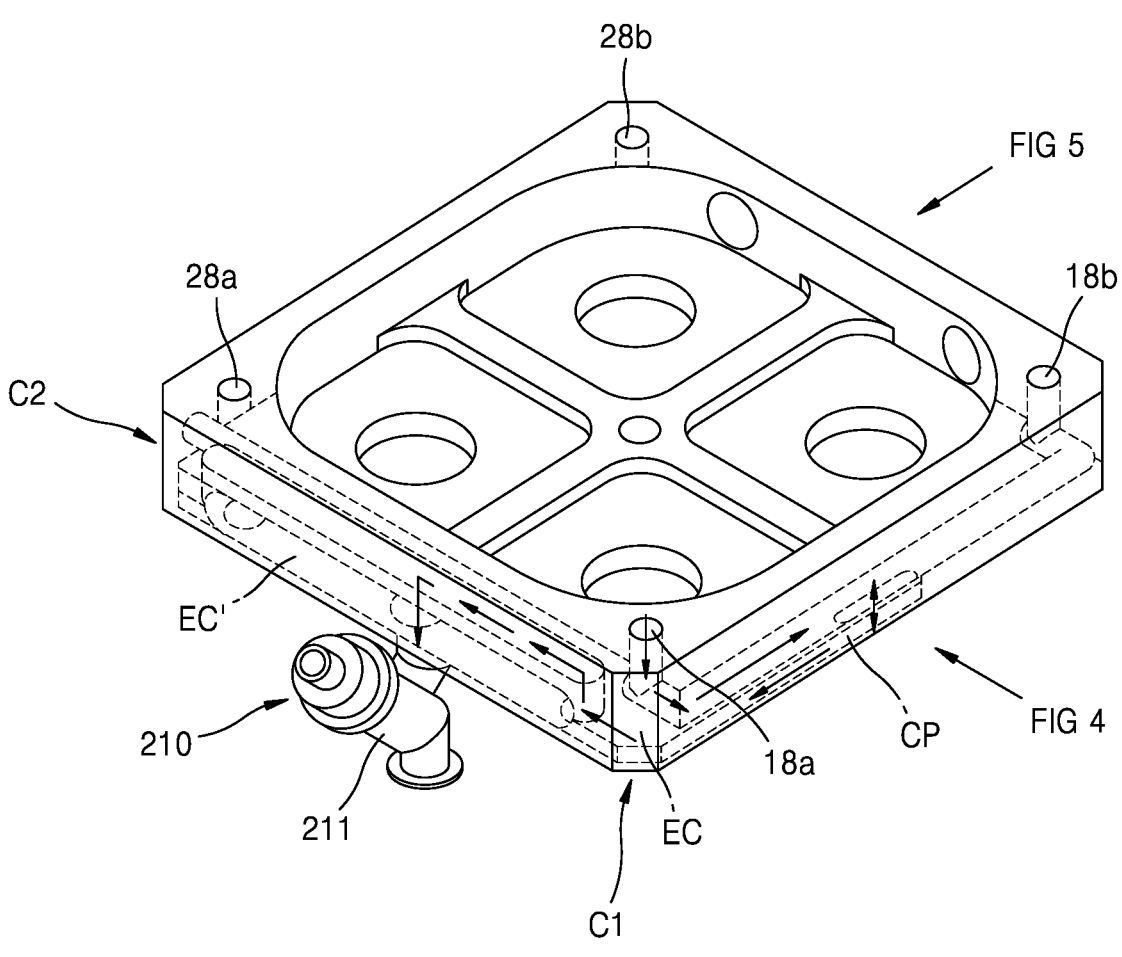
FIGS. 3 to 5 are views of a substrate processing apparatus according to some embodiments of the inventive concept.
Figure 4:
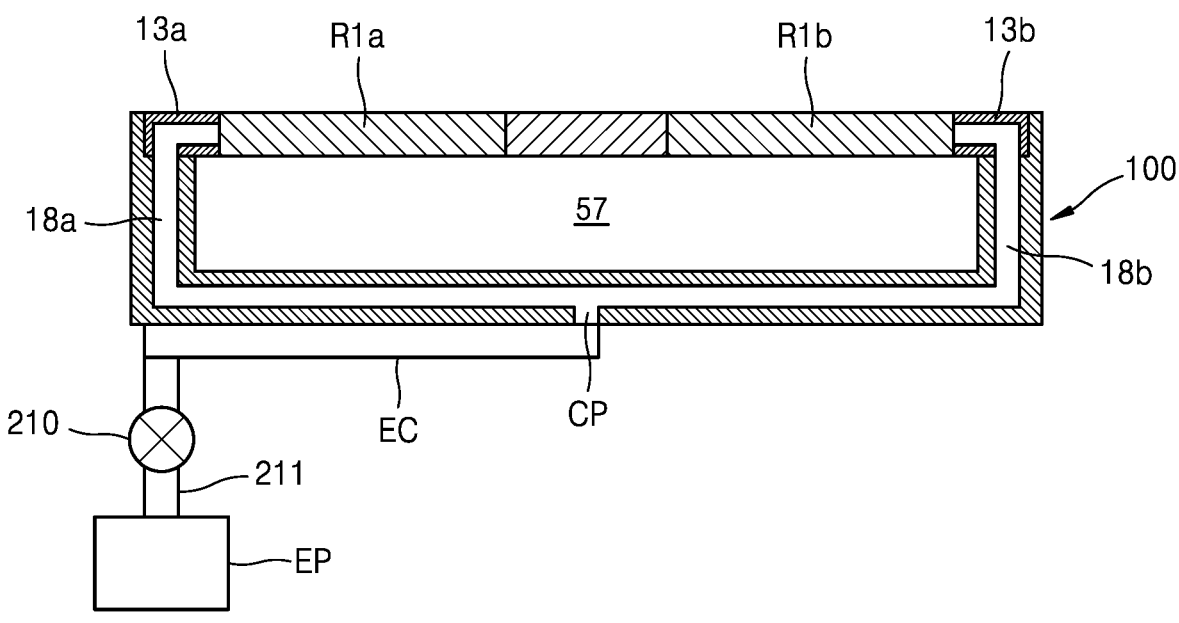
Figure 5:
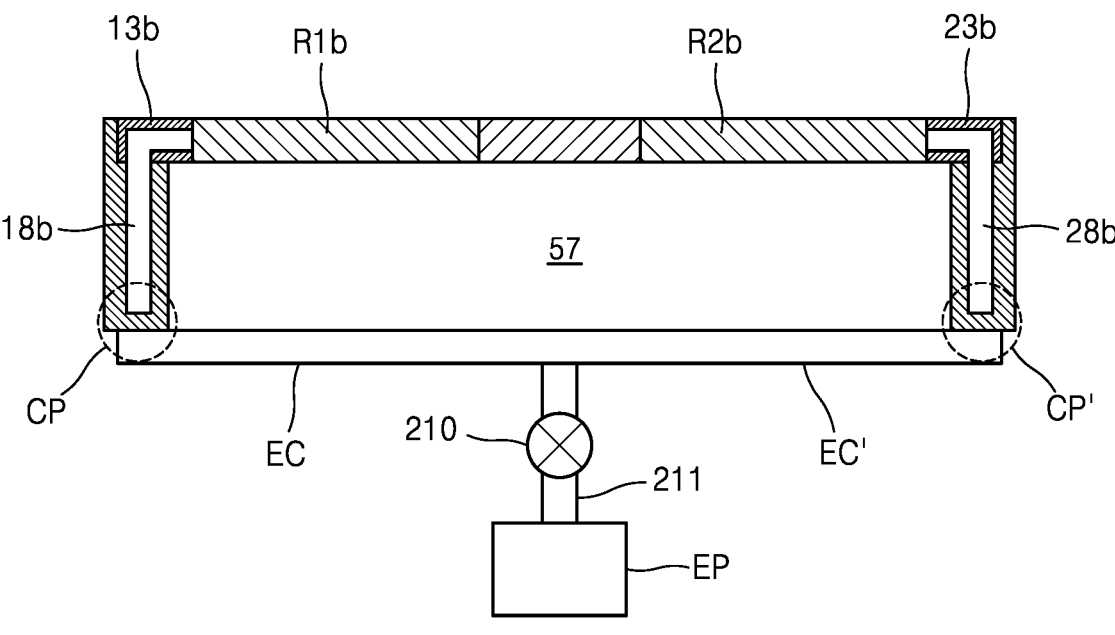

FIGS. 3 and 5 are views of a substrate processing apparatus according to some embodiments of the inventive concept. In more detail, FIG. 3 shows a portion (e.g., exhaust lines 18 and 28, a connection port CP, an external path EC connected to an external pump, etc.) of the substrate processing apparatus excluding a lid (i.e., a processing unit and an exhaust unit) and an exhaust port. FIG. 4 is a view of FIG. 3 in one direction, and FIG. 5 is a view of FIG. 3 in another direction. The substrate processing apparatus according to the embodiments may be a variation of the substrate processing apparatus according to the above-described embodiments. Hereinafter, repeated descriptions of the embodiments will not be given herein.

Referring to FIGS. 3 to 5, exhaust lines 18 and 28 are formed in the partition 100. The exhaust lines 18 and 28 are connected to the external path EC through the connection port CP and the external path EC is connected to a main exhaust path 211. Therefore, gas in a reaction space and gas in a lower space are exhausted to an exhaust pump EP via exhaust ports 13 and 23, the exhaust lines 18 and 28, the external path EC, and the main exhaust path 211. Although not shown in the drawings, each of the exhaust ports 13 and 23 is provided with a flow controller according to embodiments of the inventive concept.

As shown in FIG. 4, two reactors R1*a* and R1*b* in a first direction use inner exhaust lines 18 (18*a* and 18*b*), and the remaining two reactors in a direction opposite to the first direction use other inner exhaust lines 28 (28*a* and 28*b*). The two inner exhaust lines 18 and 28 are connected to external paths EC and EC' through connection ports CP and CP', respectively. The external path EC may be implemented in one configuration or in a plurality of configurations.

As a result, it can be seen that the four reactors use at least one of external paths EC and EC', the main exhaust path 211, and the exhaust pump EP. An isolation valve 210 may be added to the main exhaust path 211. Therefore, the exhaust pump EP may be protected from the outside atmosphere by the isolation valve 210 during a maintenance period. Further, a pressure control valve (e.g., a throttle valve) may be added to the main exhaust path 211. The external paths EC and EC' may be fixed to be in close contact with a lower surface of the partition 100 of an outer chamber so as not to move. In an alternative embodiment, the two inner exhaust lines 18 and 28 may be connected to each other within a bottom wall of the partition 100 of the outer chamber and directly connected to the main exhaust path 211, without the external paths EC and EC'.

Referring again to FIG. 3, the first external path EC connected to the first connection port CP may extend below the partition 100 towards a first corner portion C1 of the outer chamber. In addition, the second external path EC' connected to the second connection port CP' (not shown) may extend below the partition 100 towards a second corner portion C2 of the outer chamber. The exhaust pump EP may be arranged on one surface of the substrate processing apparatus, for example, corresponding to the center between the first corner portion C1 and the second corner portion C2. The first external path EC may extend from the portion extending to the first corner portion C1 to the exhaust pump EP. Also, the second external path EC' may extend from the portion extending to the second corner portion C2 to the exhaust pump EP.

Figure 6:
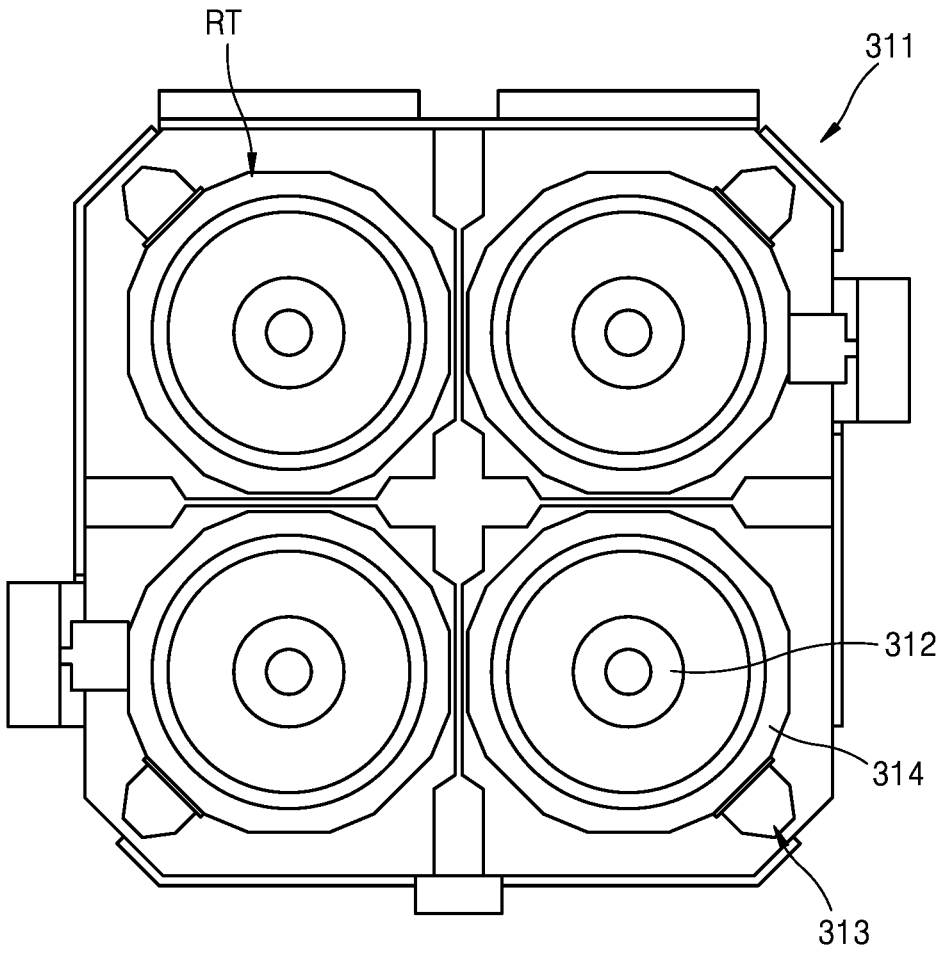
FIG. 6 is a view of a substrate processing apparatus according to embodiments of the inventive concept.

FIG. 6 is a view of a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

FIG. 6 shows an upper surface of a multi-reactor chamber 311. A plurality of reactors RT are arranged in the chamber 311 and one side of each of the reactors RT is connected to an exhaust port 313. FIG. 6 shows that each reactor RT is connected to an exhaust port 313, and the exhaust port 313 is arranged asymmetrically with respect to the center of each reactor RT.

A plurality of exhaust lines (not shown) may be formed in a partition of the chamber 311. For example, the chamber 311 may be rectangular, and the plurality of exhaust lines may include a first exhaust line, a second exhaust line, a third exhaust line, and a fourth exhaust line. In some embodiments, the first to fourth exhaust lines may be arranged corresponding to four corners of the rectangle.

The chamber 311 may include a first reactor, a second reactor, a third reactor, and a fourth reactor. Each reactor may include a substrate support unit, at least one ring, a processing unit, an exhaust unit, and an exhaust port.

In more detail, the first reactor may include a first substrate support unit (not shown) accommodated in the partition of the chamber 311, at least one first ring surrounding the first substrate support unit, a first processing unit 312 on the first substrate support unit, a first exhaust unit 314 connected to a first reaction space between the first substrate support unit and the first processing unit 312, and a first exhaust port 313 connected to at least a portion of the first exhaust unit 314. As described above, the gas in the first reaction space and the gas in the lower space below the first substrate support unit may meet each other outside the first reaction space. In addition, the gas in the first reaction space and the gas in the lower space below the first substrate support unit may be transmitted to the first exhaust unit 314 through different channels. The different channels may be separated by the at least one first ring. The different channels may also extend along different surfaces of the at least one first ring.

The second reactor may include a second substrate support unit (not shown) accommodated in the partition of the chamber 311, at least one second ring surrounding the second substrate support unit, a second processing unit 312 on the second substrate support unit, a second exhaust unit 314 connected to a second reaction space between the second substrate support unit and the second processing unit 312, and a second exhaust port 313 connected to at least a portion of the second exhaust unit 314. As described above, gas in the second reaction space and gas in a lower space below the second substrate support unit may meet each other outside the second reaction space. In addition, the gas in the second reaction space and the gas in the lower space below the second substrate support unit may be transmitted to the second exhaust unit 314 through different channels. The different channels may be separated by the at least one second ring. The different channels may also extend along different surfaces of the at least one second ring.

The third reactor may include a third substrate support unit (not shown) accommodated in the partition of the chamber 311, at least one third ring surrounding the third substrate support unit, a third processing unit 312 on the third substrate support unit, a third exhaust unit 314 connected to a third reaction space between the third substrate support unit and the third processing unit 312, and a third exhaust port 313 connected to at least a portion of the third exhaust unit 314. As described above, the gas in the third reaction space and the gas in the lower space below the third substrate support unit may meet each other outside the third reaction space. In addition, the gas in the third reaction space and the gas in the lower space below the third substrate support unit may be transmitted to the third exhaust unit 314 through different channels. The different channels may be separated by the at least one third ring. The different channels may also extend along different surfaces of the at least one third ring.

The fourth reactor may include a fourth substrate support unit (not shown) accommodated in the partition of the chamber 311, at least one fourth ring surrounding the fourth substrate support unit, a fourth processing unit 312 on the fourth substrate support unit, a fourth exhaust unit 314 connected to a fourth reaction space between the fourth substrate support unit and the fourth processing unit 312, and a fourth exhaust port 313 connected to at least a portion of the fourth exhaust unit 314. As described above, the gas in the fourth reaction space and the gas in the lower space below the fourth substrate support unit may meet each other outside the fourth reaction space. In addition, the gas in the fourth reaction space and the gas in the lower space below the fourth substrate support unit may be transmitted to the fourth exhaust unit 314 through different channels. The different channels may be separated by the at least one fourth ring. The different channels may also extend along different surfaces of the at least one fourth ring.

FIG. 7 is a view of a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

Referring to FIG. 7, the step 190 on the support TLD on which the flow control ring FCR is seated may be included in an outer ring I. That is, the outer ring I may be arranged between the flow control ring FCR and the support TLD, and the step 190 may be implemented by the outer ring I. Although the outer ring I having a rectangular cross-section is shown in FIG. 7, the cross-section of the outer ring I may have various shapes.

Figure 8:
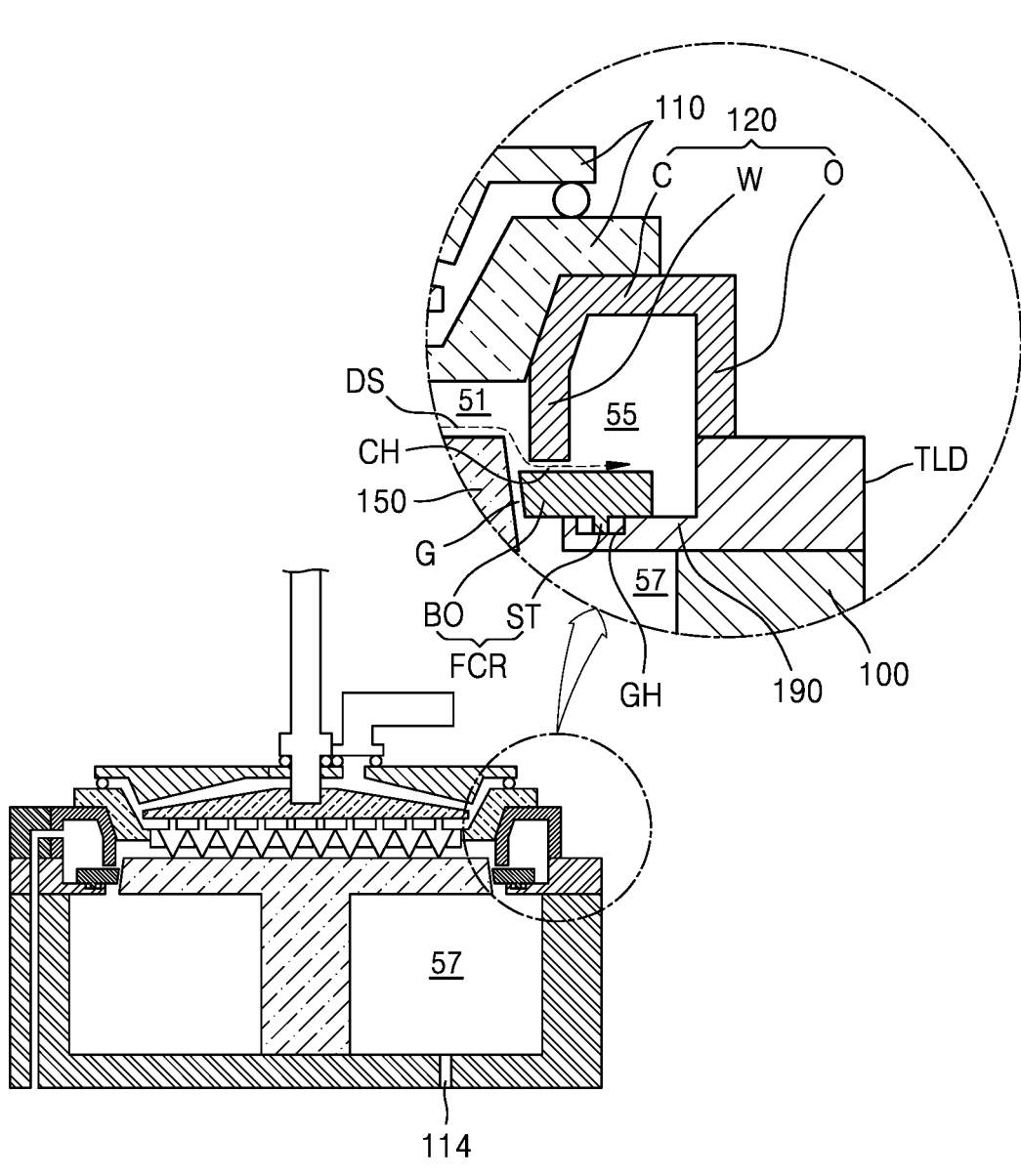
FIG. 8 is a view of a substrate processing apparatus according to embodiments of the inventive concept.
Figure 9:
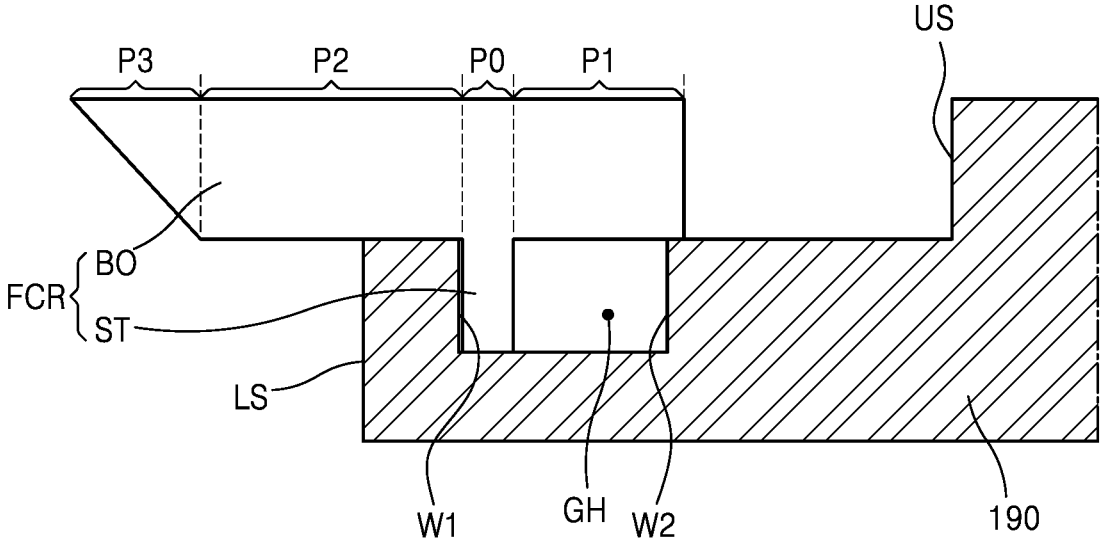
FIGS. 9 to 11 are detailed cross-sectional views of a flow control ring and a step of the substrate processing apparatus of FIG. 8.
Figure 10:
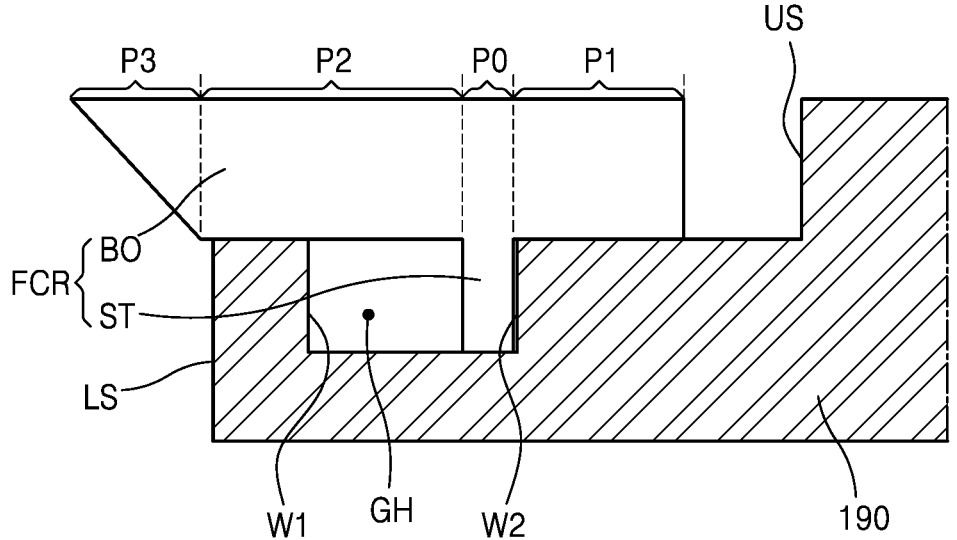
Figure 11:
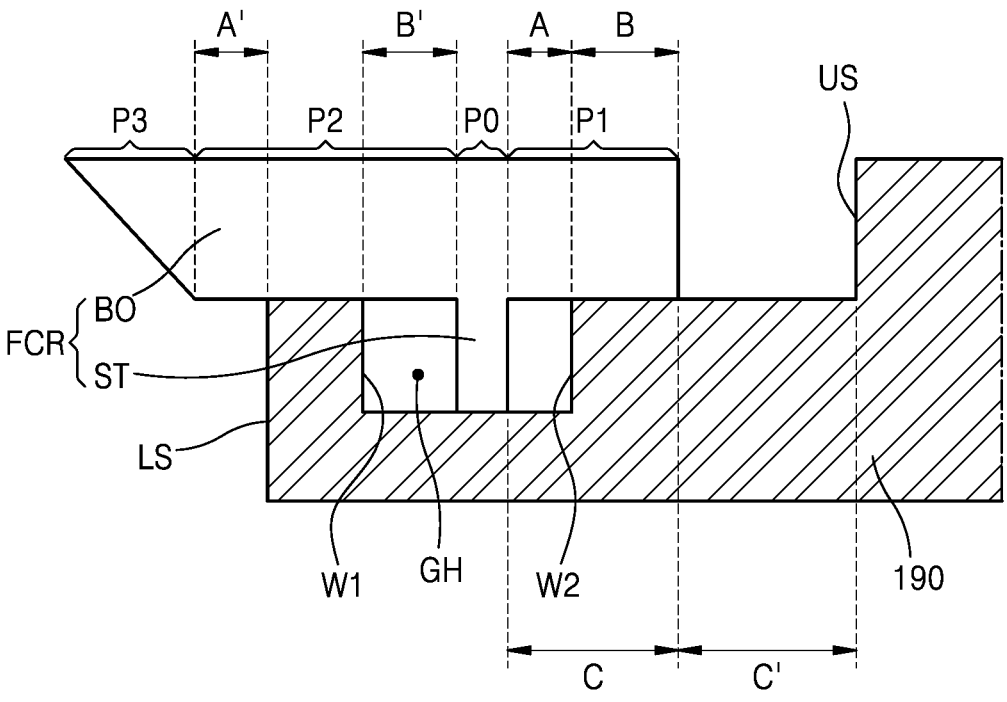

FIG. 8 schematically shows a substrate processing apparatus according to embodiments of the inventive concept, and FIGS. 9 to 11 are detailed cross-sectional views of a flow control ring and the step 190 of the substrate processing apparatus of FIG. 8. The substrate processing apparatus according to the embodiments may be a variation of the substrate processing apparatus according to the above-described embodiments. Hereinafter, repeated descriptions of the embodiments will not be given herein.

Referring to FIG. 8, the step 190 may include a guide groove GH, and the flow control ring FCR may include a stopper ST extending toward the guide groove GH. For example, the flow control ring FCR may include a ring body BO extending from a second slope and the stopper ST extending from the ring body BO toward the guide groove GH of the step 190. The stopper ST may limit the range of movement of the flow control ring FCR together with the guide groove GH.

In more detail, as shown in FIGS. 9 to 11, the ring body BO may include a central portion P0 from which the stopper ST extends, a first portion P1 extending in a first direction from the central portion P0, a second portion P2 extending in a second direction opposite to the first direction from the central portion P0, and an inclined portion P3 extending from the second portion P2 to form a second slope. A portion extending to the right from the central portion P0 based on FIG. 8 is the first portion P1 of the ring body BO, and a portion extending to the left from the central portion P0 is the second portion P2 of the ring body BO.

Meanwhile, the guide groove GH may include a first sidewall W1 and a second sidewall W2 facing the first sidewall W1. The first sidewall W1 may be a side surface close to the second slope, and the second sidewall W2 may be defined as a side surface away from the second slope.

In this case, the first portion P1 of the ring body BO may extend so that the guide groove GH is covered by the first portion P1 in a state where the stopper ST is in contact with the first sidewall W1 of the guide groove GH (see FIG. 9). That is, when viewed based on FIGS. 8 and 9, the sum of a length of the first portion P1 extending from the central portion P0 to the right and a width of the central portion P0 (or the stopper ST) may be greater than a lateral length of the guide groove GH. With this configuration, contamination of the guide groove GH by a process gas may be prevented. For example, after the process, gas may be prevented from penetrating into or remaining in the guide groove GH.

In some embodiments, in the second portion P2 of the ring body BO, the entire inclined portion P3 of the ring body BO may extend to protrude from the step 190 in a state where the stopper ST is in contact with the second sidewall W2 of the guide groove GH (see FIG. 10). That is, when viewed based on FIGS. 8 and 10, the sum of a length of the second portion P2 extending from the central portion P0 to the left and the width of the central portion P0 (or the stopper ST) may be greater than a length from the second sidewall W2 of the guide groove GH to a lower side surface LS of the step 190. Due to this configuration, a decrease in contact between the first slope of the substrate support unit 150 and the second slope of the flow control ring FCR may be prevented.

In an additional embodiment, the first portion P1 may extend so that a side surface of the first portion P1 and an upper side surface US of the step 190 are apart from each other in a state where the stopper ST is in contact with the second sidewall W2 of the guide groove GH (see FIG. 10). That is, when viewed based on FIGS. 8 and 10, the length of the first portion P1 extending to the right from the central portion P0 may be less than a distance between the second sidewall W2 of the guide groove GH and the upper side surface US of the step 190. With this configuration, a collision between the first portion P1 of the stopper ST and the upper side surface US of the step 190 may be prevented.

A positional relationship of components of the above-described flow control ring is collectively shown in FIG. 11. Referring to FIG. 11, it can be seen that the following relationship is established between the components.

Relationship 1: When a distance from the stopper ST to the second sidewall W2 of the guide groove GH is A, and a width of a portion protruding from the step 190 of the second portion P2 is A', A' is greater than or equal to A. Accordingly, a decrease in contact between the substrate support unit 150 and the flow control ring FCR may be prevented.

Relationship 2: When a distance from the side surface of the first portion P1 to the second sidewall W2 of the guide groove GH is B, and a distance from the stopper ST to the first sidewall W1 of the guide groove GH is B', B is greater than B'. Therefore, contamination of the guide groove GH by a residual gas may be prevented.

Relationship 3: When a width of the first portion P1 is C, and a distance from the first portion P1 to the upper side surface US of the step 190 is C', C is equal to or less than C'. Accordingly, a collision between the stopper ST and the upper side surface US of the step 190 may be prevented.

Figure 12:
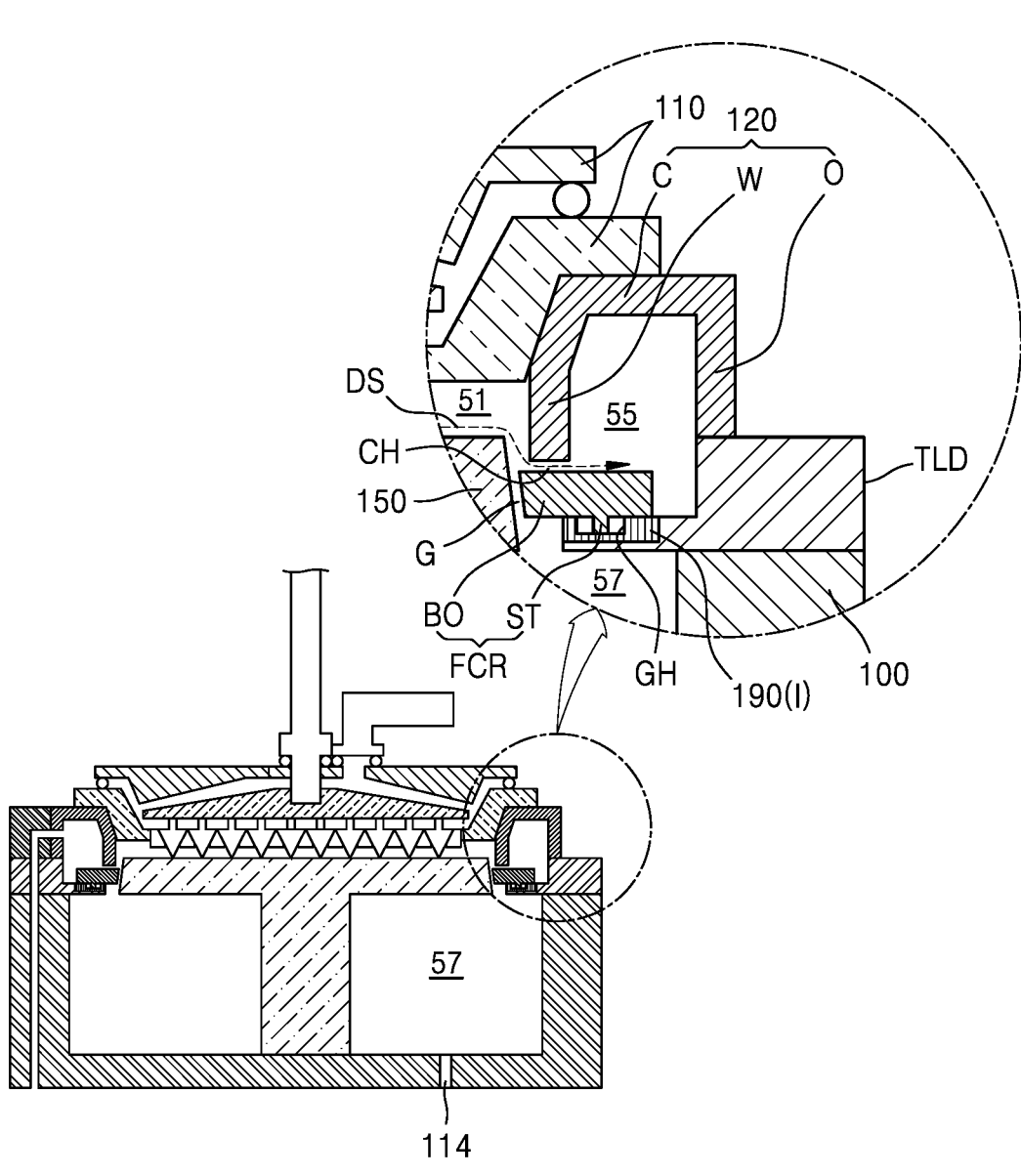
FIG. 12 is a view of a substrate processing apparatus according to embodiments of the inventive concept.

FIG. 12 schematically shows a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

Referring to FIG. 12, the step 190 on the support TLD on which the flow control ring FCR is seated may be implemented by the outer ring I. In this case, the outer ring I may be formed to have the guide groove GH, and the stopper ST of the flow control ring FCR may be inserted into the guide groove GH of the outer ring I. As described above, the outer ring I may be implemented in various shapes (e.g., an L shape).

Figure 13:
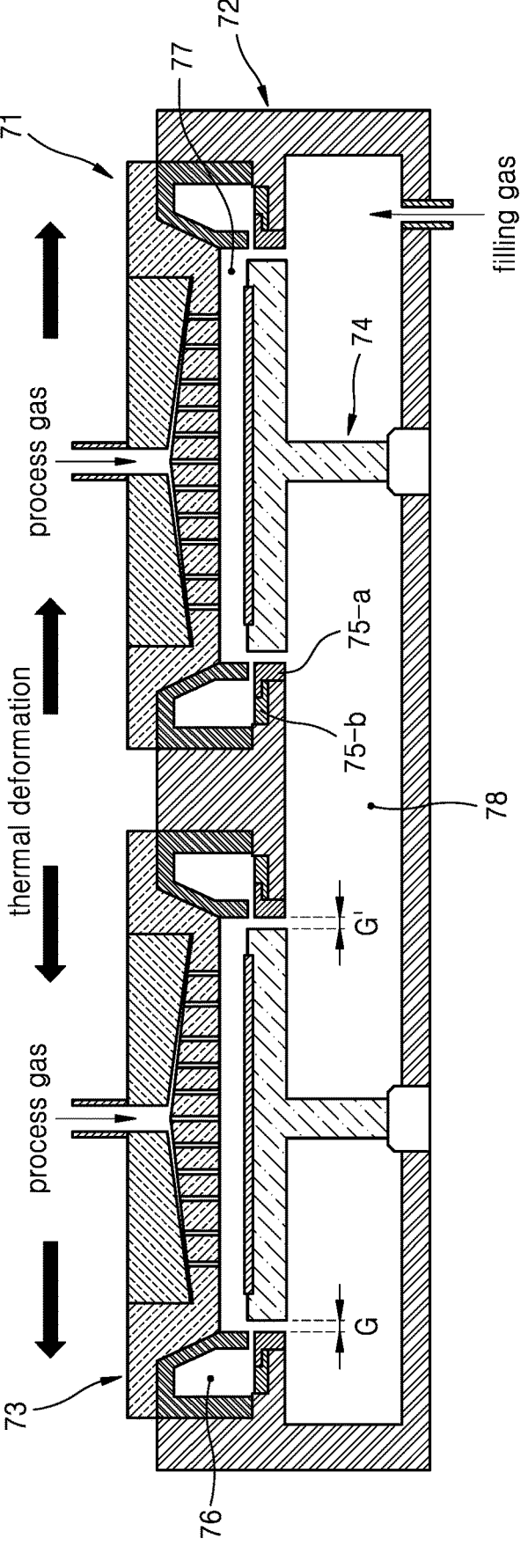
FIGS. 13 and 14 are views of a substrate processing apparatus according to embodiments of the inventive concept.

FIGS. 13 and 14 schematically show a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

Referring to FIG. 13, in the substrate processing apparatus including a plurality of reactors, deformation of the substrate processing apparatus at a high temperature causes misalignment between reactor components. For example, in FIG. 13, due to thermal deformation of a top lid 73 due to a high temperature, the gap G between a heating block 74 and a gas-flow control ring 75-$a$ (inner ring) surrounding the heating block 74 is not constant depending on the position around the heating block 74 (G≠G'). In the gap G, by maintaining a pressure balance between a filling gas supplied from a reactor lower area 78 and a gas in a reaction space 77 and by blocking the gas in the reaction space 77 from penetrating into the reactor lower area 78, a fluid flow around a substrate is controlled and the uniformity of a thin film formed on the substrate is controlled. However, as shown in FIG. 13, when gaps G and G' between the heating block 74 and the gas-flow control ring 75-a (inner ring) are not constant, the pressure at each position of the gaps surrounding the heating block 74 is not constant, and exhaust unevenness is generated, thereby reducing the uniformity of a thin film on the substrate. Therefore, it is necessary to correct misalignment between the heating block 74 and the gas-flow control ring 75-a in a high temperature process.

The disclosure is to solve the above-mentioned problems, and more particularly, provides a method of making the gap G between the heating block and the gas-flow control ring uniform by aligning the heating block and the gas-flow control ring with each other when the substrate processing apparatus is in a high temperature state.

FIG. 14 shows an embodiment according to the disclosure. FIG. 14(a) shows a state in which a distance between a heating block and a gas-flow control ring surrounding the heating block is not constant (G≠G') because a symmetric center of the heating block and the center of an inner diameter of the gas-flow control ring do not match due to the deformation of a chamber at a high temperature (see FIG. 13).

An order of arranging heating blocks for each operation of FIG. 14 is as follows. In the embodiment according to FIG. 14, an inner wall of a gas-flow control ring 2 and a sidewall of a heating block 4 are tapered to engage with each other.

Operation 1 (a): A high temperature deforms a chamber wall 1 in a horizontal direction. At this time, the distances A and A' between an outer wall of the gas-flow control ring 2 and a wall of a step 3 of the chamber wall 1 where the gas-flow control ring 2 is arranged are constant around the gas-flow control ring 2 (A=A'). However, the gaps G and G' between an inner wall of the gas-flow control ring 2 and a sidewall of the heating block 4 are not constant (G≠G'). Therefore, in this operation, the gas-flow control ring 2 may be in the state of the inner ring 75-a of the gas-flow control ring of FIG. 13. The step 3 may be a portion of the chamber wall or may be an outer ring 75-b of the gas-flow control ring of FIG. 13.

Operation 2 (b): The heating block 4 ascends by a heating block-moving portion 5. At this time, the distances A and A' between the outer wall of the gas-flow control ring 2 and a wall of the step 3 of the chamber wall 1 where the gas-flow control ring 2 is arranged are still constant around the gas-flow control ring 2 (A=A'). However, the gaps G and G' between the inner wall of the gas-flow control ring 2 and the sidewall of the heating block 4 are still not constant (G≠G').

Operation 3 (c): The heating block 4 continues to ascend, and an inclined inner wall of the gas-flow control ring 2 makes surface contact with an inclined sidewall of the heating block 4, and is separated from the step 3 and rises together with the heating block 4. In this operation, as an inner surface of the gas-flow control ring 2 slides on a side surface of the heating block 4, the center of an inner diameter of the gas-flow control ring 2 coincides with the center of symmetry of the heating block 4. In other words, because the center of the inner diameter of the gas-flow control ring 2 that is movable moves toward the center of symmetry of the fixed heating block 4, the distances A and A' between an outer wall of the gas-flow control ring 2 and the wall of the step 3 are not constant around the gas-flow control ring 2 (A≠A').

Operation 4 (d): The heating block 4 descends and the gas-flow control ring 2 is seated on the step 3 again. As the heating block 4 continues to descend, the inner portion of the gas-flow control ring 2 and a side portion of the heating block are apart from each other to form a gap G, and the gap G is kept constant around the heating block 4 (G=G'). However, the distances A and A' between the outer wall of the gas-flow control ring 2 and the wall of the step 3 are not constant around the gas-flow control ring 2 (A≠A'). On the other hand, in an actual substrate processing operation, that is, in a processing operation, as can be seen in this operation, the heating block 4 and the gas-flow control ring 2 are apart from each other, but an upper surface of the heating block 4 is maintained higher than an upper surface of the gas-flow control ring 2. Therefore, there is a technical effect of allowing a process gas to flow smoothly from a reaction space (the upper surface of the heating block) to an exhaust path 76 (of FIG. 13) during substrate processing. Also, by maintaining such a configuration, there is an additional technical effect that may prevent a filler gas from penetrating into the reaction space (the upper surface of the heating block) through the gaps G and G'.

As can be seen through FIG. 14, by configuring the side surface of the heating block 4 and the inner surface of the gas-flow control ring 2 facing the side surface of the heating block 4 to have an inclined structure respectively and engage with each other, there is an effect of more easily self-aligning in a first direction(vertical direction) while moving the heating block 4 up and down and sliding the inner surface of the gas-flow control ring 2 on the side surface of the heating block 4 in a second direction(a direction different from a vertical direction, e.g. a lateral direction). In other words, there is a technical effect of aligning the center of symmetry of the heating block 4 and the center of the inner diameter of the gas-flow control ring 2 to match. Because the heating block 4 has a fixed position, the movable gas control ring 2 moves toward the center of symmetry of the heating block 4 and is aligned with the heating block 4, and the gaps G and G' between the heating block 4 and the gas-flow control ring 2 surrounding the heating block 4 may be kept constant (G=G').

Figure 15:
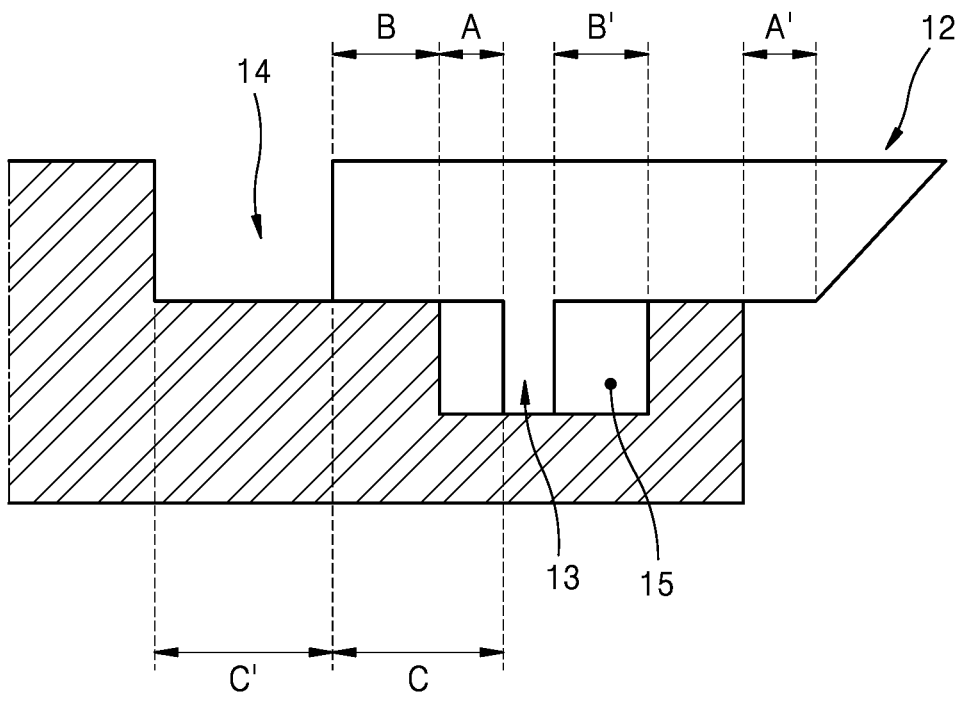
FIG. 15 is a view of various embodiments of a gas-flow control ring of a substrate processing apparatus.

FIG. 15 shows another embodiment of the gas-flow control ring.

In FIG. 15, a gas-flow control ring 12 seated on a step 14 includes a stopper 13 on one surface, for example, a surface in contact with the step 14. The step 14 may be a portion of a chamber wall. Alternatively, the step 14 may be the outer ring 75-b (in FIG. 13) of the gas-flow control ring. The step 14 includes an accommodation space for accommodating the stopper 13, for example, a stopper guide groove 15. The stopper 13 moves within the stopper guide groove 15 in a horizontal direction and prevents the gas-flow control ring 12 from being separated from the step 14. To this end, the following relationship is simultaneously established between the gas-flow control ring 12, the stopper 13, and the stopper guide groove 15.

$$A \leq ',$$

$$B > B',$$

$$C \text{ (or } A+B) \leq C'$$

When the gas-flow control ring 12 moves in a direction of a sidewall of the step 14 by establishing the relationship of A≤A', the entire inclined portion of an inner surface of the gas-flow control ring 12 continues to face a side slope of a heating block. Therefore, there is a technical effect of preventing a decrease in contact to the side slope of the heating block and facilitating alignment by sliding on the side slope of the heating block.

When the gas-flow control ring 12 moves in a direction opposite to the sidewall of the step 14 by establishing the relationship of B>B', the gas-flow control ring 12 still covers the stopper guide groove 15. Accordingly, there is a technical effect of preventing the stopper guide groove 15 from being exposed to an exhaust gas toward an exhaust path, thereby preventing the stopper guide groove 15 from being contaminated by the exhaust gas or a residual gas.

When the gas-flow control ring 12 moves toward the sidewall of the step 14 by establishing the relationship of C (or A+B)≤C', there is a technical effect of preventing an outer surface of the gas-flow control ring 12 from colliding with the sidewall of the step 14.

Thus, according to the disclosure, by configuring a side surface of a heating block and an inner surface of a gas-flow control ring surrounding the heating block to be inclined to each other, the gas-flow control ring makes alignment easier by sliding it on the side surface of the heating block at a higher temperature and a distance between the heating block and the gas-flow control ring may be kept constant.

It is to be understood that the shape of each portion of the accompanying drawings is illustrative for a clear understanding of the disclosure. It should be noted that the portions may be modified into various shapes other than the shapes shown.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a substrate support unit having a first slope;
a flow control ring arranged to surround the substrate support unit and having a second slope;
a processing unit on the substrate support unit;
an exhaust unit defining an exhaust space surrounding the reaction space; and
a channel between the reaction space and the exhaust space is lower than a first upper surface of the substrate support unit,
wherein a reaction space is formed between the substrate support unit and the processing unit,
a lower space is formed under the substrate support unit;
a gap is formed between the first slope of the substrate support unit and the second slope of the flow control ring, the reaction space and the lower space are connected to each other through the gap, and
gas is supplied by the processing unit during a processing operation of the substrate processing apparatus, and a first upper surface of the substrate support unit is higher than a second upper surface of the flow control ring during the supply of the gas, so that a portion of the first slope of the substrate support unit is exposed to the reaction space.

2. The substrate processing apparatus of claim 1, wherein, during the processing operation, the gas supplied by the processing unit flows downstream from the reaction space toward the channel.

3. The substrate processing apparatus of claim 2, wherein, while the gas flows downstream, the gas moves along the portion of the first slope of the substrate support unit.

4. The substrate processing apparatus of claim 2, wherein, with a configuration in which the gas flows downstream, inflow of gas from the lower space into the reaction space through the gap is suppressed.

5. The substrate processing apparatus of claim 1, further comprising:
a support configured to support the processing unit and the exhaust unit; and
the flow control ring is seated on a step of the support.

6. The substrate processing apparatus of claim 5, wherein the step is included in the support.

7. The substrate processing apparatus of claim 5, further comprising:
an outer ring arranged between the flow control ring and the support; and
the step is included in the outer ring.

8. The substrate processing apparatus of claim 5, wherein the step comprises a guide groove, and
the flow control ring comprises:
a ring body extending from the second slope of the flow control ring; and
a stopper extending from the ring body toward the guide groove.

9. The substrate processing apparatus of claim 8, wherein the ring body comprises:
a central portion;
a first portion extending from the central portion in a first direction;
a second portion extending from the central portion in a second direction opposite to the first direction; and
an inclined portion extending from the second portion to form the second slope of the flow control ring,
wherein the stopper extends from the central portion.

10. The substrate processing apparatus of claim 9, wherein the first portion extends so that the guide groove is covered by the first portion in a state where the stopper is in contact with a first sidewall of the guide groove.

11. The substrate processing apparatus of claim 9, wherein the second portion extends so that the entire inclined portion protrudes from the step in a state where the stopper is in contact with a second sidewall of the guide groove.

12. The substrate processing apparatus of claim 9, wherein the first portion extends so that a side surface of the first portion and a side surface of the step are apart from each other in a state where the stopper is in contact with a second sidewall of the guide groove.

13. The substrate processing apparatus of claim 9, wherein, when a distance from the stopper to a second sidewall of the guide groove is A and a width of a portion protruding from the step of the second portion is A', A' is greater than or equal to A.

14. The substrate processing apparatus of claim 9, wherein, when a distance from a side surface of the first portion to a second sidewall of the guide groove is B and a distance from the stopper to a first sidewall of the guide groove is B', B is greater than B'.

15. The substrate processing apparatus of claim 9, wherein the step comprises a side surface facing the first portion, and, when a width of the first portion is C and a distance from the first portion to the side surface is C', C is equal to or less than C'.

16. The substrate processing apparatus of claim 1, wherein the substrate support comprises a heater block, and wherein, as the substrate support unit moves up, the first slope and the second slope contact each other and thus the flow control ring moves up together, and thereafter, as the substrate support unit moves down, the gap having a constant width is formed over a circumference of the substrate support unit.

17. A substrate processing apparatus comprising:

a substrate support unit;

a flow control ring arranged to surround the substrate support unit;

a processing unit on the substrate support unit;

an exhaust unit defining an exhaust space surrounding the reaction space; and a channel between the reaction space and the exhaust space is lower than a first upper surface of the substrate support unit, wherein a reaction space is formed between the substrate support unit and the processing unit, a lower space is formed under the substrate support unit, a gap is formed between the substrate support unit and the flow control ring, the reaction space and the lower space are connected to each other through the gap, a first upper surface of the substrate support unit is higher than a second upper surface of the flow control ring, and gas supplied by the processing unit flows from a space on the first upper surface to a space on the second upper surface.

18. The substrate processing apparatus of claim 17, wherein the substrate support unit comprises a heater block and a first slope and the flow control ring arranged to surround the substrate support unit and having a second slope, wherein, as the substrate support unit moves in a first direction, the first slope and the second slope contact each other, and due to the contact, the flow control ring slides in a second direction that is different from the first direction.

* * * * *